United States Patent [19]
Masuda et al.

[11] Patent Number: 6,064,234
[45] Date of Patent: May 16, 2000

[54] LOGIC CIRCUIT

[75] Inventors: Noboru Masuda, Tokorozawa; Yoshio Miki, Kodaira; Shun Kawabe, Machida, all of Japan

[73] Assignee: Hitachi, Ltd., Tokyo, Japan

[21] Appl. No.: 09/134,335

[22] Filed: Aug. 14, 1998

[30] Foreign Application Priority Data

Aug. 27, 1997 [JP] Japan ..................................... 9-230680

[51] Int. Cl.$^7$ ............................................... H03K 19/094
[52] U.S. Cl. ........................... 326/119; 326/106; 326/108; 326/121
[58] Field of Search ................... 326/119, 112, 326/121, 106, 108, 83

[56] References Cited

U.S. PATENT DOCUMENTS 5,291,076  3/1994  Bridges et al. ........................ 307/449
5,661,417  8/1997  Kondoh ..................................... 326/87

Primary Examiner—Michael Tokar
Assistant Examiner—Anh Tran
Attorney, Agent, or Firm—Antonelli, Terry, Stout & Kraus, LLP

[57] ABSTRACT

A logic circuit for use as a selector having multiple inputs and high operation speed. The logic circuit includes a first FET having a first electrode connected to a first power supply, a second electrode connected to an output terminal and a third electrode connected to an intermediate control node, and a plurality of logic blocks parallelly connected between the second power supply and the output terminal. Each logic block includes second and third FETs being of a conductivity type opposite to that of the first FET and connected in series between the output terminal and a second power supply. Each logic block also includes a fourth FET being of the same conductivity type as the second and third FETs and having a third electrode connected to the third electrode of the second FET, a first electrode connected to the third electrode of the third FET and a second electrode connected to the intermediate control node. The conduction resistance between the output terminal and the first power supply is reduced and the parasitic capacitance added to the output terminal is also reduced, thereby allowing the logic circuit to be operated at high speed.

30 Claims, 8 Drawing Sheets $F = \overline{((A \cdot B) + (C \cdot D))}$

FUNCTION CONFIGURATION OF
$F = ((A \cdot B) + (C \cdot D))$

CMOS 2-INPUT
MULTIPLEXER

LOGIC CIRCUIT

BACKGROUND OF THE INVENTION

The present invention relates to a logic circuit in a semiconductor integrated circuit chip. More particularly, the present invention relates to a selector circuit having an operation speed not affected by the number of selections from which the selector circuit must select.

When a logic circuit operating as a selector circuit is made by using MOS transistors, a conventional practice is to implement the selector circuit using the circuit, illustrated in FIG. 1.8 on page 12 of "Principle of CMOS VLSI design," published by Maruzen Company Ltd. on Aug. 30, 1988, or a circuit in FIG. 1.10 on page 14 of the same book. These circuits are illustrated in FIGS. 3 and 4 of the present application.

In the circuit illustrated in FIG. 3, setting A to a high level and C to a low level causes a signal which has inverted a signal input to B to be output at F whatever the state of a signal input to D. Setting A to a low level and C to a high level causes a signal which has inverted a signal input to D to be output at F regardless of the state of a signal input to B. Hence, this circuit can be used as a selector circuit that selects one of two signals B and D with the signals A and C as control signals.

The circuit illustrated in FIG. 4 uses a complementary switch having N- and P-type transistors. In this circuit, setting S to a high level and S bar to a low level causes a signal input to A to be output whatever the state of a signal input to B. Setting S to a low level and S bar to a high level causes a signal input to B to be output whatever the state of the signal input to A. Thus, this circuit, too, can be used as a selector circuit that selects one of two signals A and B with signals S and S bar as control signals.

Although the above-described circuits poses no problem when used as a selector circuit to choose one of two signals, these conventional selector circuits have a drawback that the circuit speed decreases significantly as the number of choices increases.

When, for example, a selector circuit designed to select one of four signals is made by expanding the circuit of FIG. 3, a circuit illustrated in FIG. 5 is obtained.

In the circuit of FIG. 5, when an output terminal 170 changes from a low level to a high level, an electric current flows through four series-connected PMOS devices among those 502–504 and 511–514 connected between a power supply terminal 190 and the output terminal 170. The conduction resistance at that time is twice that of the circuit of FIG. 3. Because many PMOS devices are connected to the current path, a parasitic capacitance also increases. Increases in both the conduction resistance and the parasitic capacitance significantly reduce the circuit operation speed. A further increase in the number of choices will result in a further decrease in the operation speed.

A circuit illustrated in FIG. 6 is made by expanding the circuit of FIG. 4. In the circuit of FIG. 6, the parasitic capacitance added to the output terminal 170 increases from that of the circuit of FIG. 4 by an amount corresponding to two PMOS devices and two NMOS devices. Thus, the operation speed is reduced significantly. Further, when in the circuit of FIG. 6 the MOS transistors 601, 611 conduct to output from the output terminal 170 a signal applied to an input terminal 161, a load applied to the output terminal 170 also works as a load of a previous stage circuit that drives the input terminal 161. This means that the later stage circuit of FIG. 6 influences the operation of a previous stage circuit. Hence, if an LSI logic is to be designed by using the circuit of FIG. 6, it is necessary to consider the loads of circuits two stages ahead, making the logic design complicated. If the circuit of FIG. 6 with an inverter or the like added to the input terminals 161–164 or the output terminal 170 is treated as one circuit, this problem is eliminated. But in that case the delay time increases by an amount corresponding to one stage of inverters.

SUMMARY OF THE INVENTION

A first object of the present invention is to provide a selector circuit having an operation speed which is not reduced due to an increase in the number of choices.

A second object of the present invention is to provide a selector circuit that occupies at most an area the same as that of a conventional selector circuit having roughly the same operation speed.

A third object of the present invention is to provide a selector circuit in which a load added to an output terminal thereof does not affect a previous stage circuit.

A fourth object of the present invention is to provide a selector circuit that achieves the above described first to third objects and in which a leak current does not flow during steady state operation.

The above first to third objects of the present invention are achieved by providing a logic circuit having a first field effect transistor (FET) having a first electrode thereof connected to a first power supply, a second electrode thereof connected to an output terminal and a third electrode thereof connected to an intermediate control node, and a plurality of logic blocks parallelly connected between a second power supply, and the output terminal.

Each logic block includes second and third FETs being of a conductivity type opposite to that of the first FET and connected in series between the output terminal and the second power supply, and a fourth FET being of the same conductivity type as the second and third FETs and having a third electrode connected to the third electrode of the second FET, a first electrode connected to the third electrode of the third FET and a second electrode connected to an intermediate control node. Each of the FETs described above can be of MOS, junction or any other type.

The first and second objectives of the present invention can be achieved using a method of supplying signals of connecting a select signal to the third electrode of the second FET in each of the logic blocks, connecting a selectable signal to the third electrode of the third FET in each of the logic blocks, supplying the select signals from a select signal supply circuit to select and conduct only one of the second FETs, and determining a signal to be output to the output terminal according to the selectable signal that corresponds to the logic block including the selected and conducting second FET.

The first and second objects of the present invention are effectively achieved by using MOS type FETs and setting the conductivity type of the first FET to a P-channel type and the conductivity types of the second to fourth FETs to an N-channel type.

The fourth object of the present invention is realized by adding a fifth FET, which is of the same conductivity type as the first FET, and having a first electrode connected to the first power supply, a third electrode connected to the output terminal and a second electrode connected to the intermediate control node.

The present invention can be operated in a processor which includes a register buffer which stores data, a decoder which decodes instructions and outputs a decoded result, and a plurality of operation units each of which performs an operation on data in the register buffer or an output from another operation unit according to the decoded result from the decoder, and outputs a result of the operation to the register buffer or the another operation unit.

The present invention, when operated in a processor, includes and a logic circuit having a first FET with a first electrode connected to a first power supply, a second electrode connected to an output terminal and a third electrode connected to an intermediate control node, and a plurality of logic blocks parallelly connected between a second power supply and the output terminal. Each logic block includes second and third FETs being of a conductivity type opposite to that of the first FET and connected in series between the output terminal and the second power supply, and a fourth FET being of the same conductivity type as the second and third FETs. The fourth FET includes a third electrode connected to the third electrode of the second FET, a first electrode connected to the third electrode of the third FET and a second electrode connected to the intermediate control node. With respect to one of the operation units a signal responsive to the decoded result of the decoder circuit is input to the third electrode of the second FET. The data in the register buffer or the output from another operation unit is input to the third electrode of the third FET, and an output from the output terminal is input to the operation unit.

The logic circuit of the present invention provides a selector circuit that can achieve high speed operation regardless of the number of choices of the types of circuit succeeding or preceding the selector circuit. The selector circuit includes a plurality of select signal terminals to which select signals are input, a plurality of selectable signal terminals, corresponding to the select signal terminals, to which selectable signals are input terminals, a first power supply terminal, a second power supply terminal, and an output terminal which outputs according to the signals input to the select signal terminals a signal corresponding to signals input to the selectable signal terminals. When the select signals are input to the select signal terminals, signals input to the selectable signal terminals control conduction between the first power supply terminal and the output terminal and also conduction between the second power supply terminal and the output terminal. When non-select signals are input to the select signal terminals, conduction between the first power supply terminal and the output terminal is turned off and conduction between the second power supply terminal and the output terminal is turned off.

BRIEF DESCRIPTION OF THE DRAWINGS

The scope of the present invention will be apparent from the following detailed description, when taken in conjunction with the accompanying drawings, and such detailed description and specific examples, while indicating preferred embodiments of the invention, are given by way of illustration only, since various changes and modifications within the spirit and scope of the invention will become apparent to those skilled in the art from this detailed description, in which.

DESCRIPTION OF THE PREFERRED EMBODIMENTS

Figure 1:
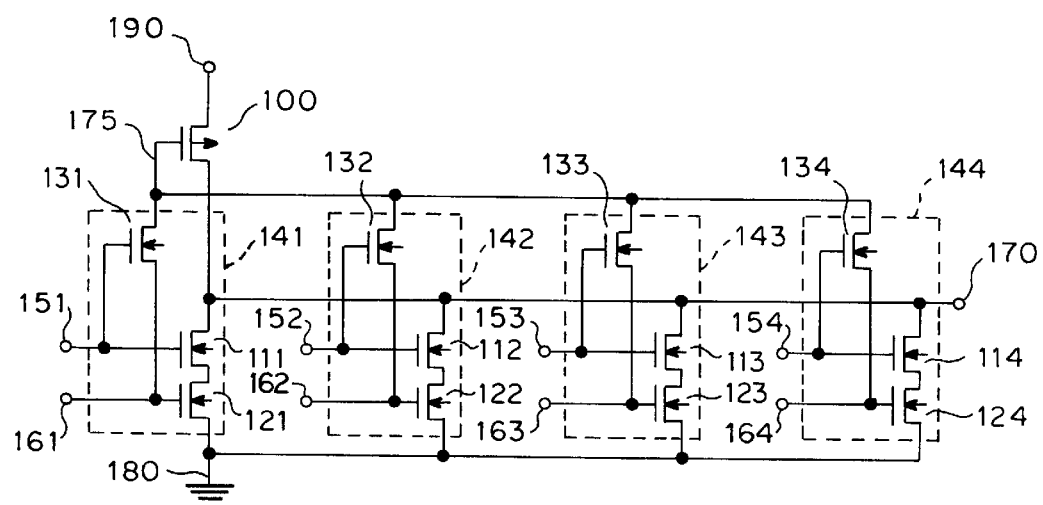
FIG. 1 is a circuit diagram illustrating an embodiment of the logic circuit of the present invention.

One embodiment of the logic circuit of the present invention is illustrated in FIG. 1. It should be noted that the FETs illustrated in FIG. 1 and each of the other figures can be of the MOS, junction type or any other type. For the purpose of simplicity in the description below the FETs will be described as MOS type FETs each having source, drain and gate electrodes and being of P-channel or N-channel conductivity. The present invention is not limited to the FET type described below but can be of any type.

In FIG. 1, reference numeral 100 represents a P-channel type MOS FET. Reference numbers 111–114, 121–124, 131–134 denote an N-channel type MOS FET. Reference numbers 151–154 are input terminals to which select signals are to be connected. Reference numbers 161–164 are input terminals to which signals to be selected or selectable signals are to be connected. Reference number 170 is an output terminal. Reference number 180 is a power supply terminal on the low-potential side. Reference number 190 is a power supply terminal on the high-potential side. Reference number 175 is an intermediate node for control. Of these, N-channel type MOS FETs, 111, 121 and 131 form a logic block 141; 112, 122 and 132 form a logic block 142; 113, 123 and 133 form a logic block 143; and 114, 124 and 134 form a logic block 144.

Next, the operation of this logic circuit will be explained. The select signals supplied to the input terminals 151–154 are set so that only one is high and the remaining signals are low. Assuming that only the select signal connected to the input terminal 151 is high and the other signals connected to input terminals 152–154 are all low, the MOS FETs 111 and 131 are turned on and the other MOS FETs 112–114 and 132–134 are turned off.

At this time if the signal applied to the input terminal 161 is low, the MOS FET 121 is turned off. Because the MOS FETs 121 and 112–114 are turned off, the output terminal 170 is disconnected from the low-potential side power supply terminal 180. Because the MOS FET 131 is turned on and the MOS FETs 132–134 are turned off, the low-level signal applied to the input terminal 161 is transmitted to the intermediate control node 175 for turning on the MOS FET 100. Hence, the output terminal 170 is connected to the high-potential side power supply terminal 190 and goes high. In this case, the conduction resistance is provided only by the resistance of the MOS FET 100.

Conversely when the signal applied to the input terminal 161 is high, the MOS FET 121 turns on. Because the MOS FET 111 is also turned on, the output terminal 170 is connected to the low-potential side power supply terminal 180. The intermediate control node 175 is applied with a voltage which is a MOS FET 131 threshold voltage lower than the high-level signal applied to the input terminal 161. Thus the MOS FET 100 goes to the nearly turned-off state and the output terminal 170 goes low. In this way, the output terminal 170 produces a signal which has inverted a signal applied to the input terminal 161 whatever the state of the signals applied to the input terminals 162–164.

The above explanation concerns a case where the select signal connected to the input terminal 151 of the logic block 141 is high. When any of the select signals connected to the input terminals 152–154 of the other logic blocks 142–144 goes high, a signal corresponding to the logic block is selected from among the input terminals 162–164 and a signal applied to the input terminals 162–164 is inverted and output to the output terminal 170. Thus, the circuit of FIG. 1 works as a selector circuit.

The circuit of FIG. 1 is a selector circuit which includes a plurality of select signal terminals 151–154 to which select signals are input, a plurality of selectable signal terminals 161–164 each corresponding to one of the select signal terminals 151–154 to which selectable signals are input, a first power supply terminal 190, a second power supply terminal 180, and an output terminal 170 that, according to the select signals input to the plurality of select signal terminals, outputs one of the selectable signals input to the plurality of selectable signal terminals. With this circuit, when a select signal is input to a select signal terminal 151–154, the MOS FET 100 controls the conduction between the first power supply terminal 190 and the output terminal 170 and also controls the conduction between the second power supply terminal 180 and the output terminal 170. When a non-select signal is input to the select signal terminal 151–154, the conduction between the first power supply terminal 190 and the output terminal 170 is turned off and the conduction between the second power supply terminal 180 and the output terminal 170 is also turned off.

Next, it is illustrated in the following that the circuit of FIG. 1 is faster than the conventional circuit of FIG. 5. In the circuit of FIG. 1, when the output terminal 170 rises from low level to high level, a current flows from the (high-potential side) power supply terminal 190 to the output terminal 170 through the MOS FET 100. The conduction resistance at this time is provided only by the resistance of the MOS FET 100. When, in the circuit of FIG. 5 on the other hand, the output terminal 170 rises from low level to high level, a current flows from the high-potential side power supply terminal 190 to the output terminal 170 through, for example, MOS FETs 511, 502, 503 and 504. The conduction resistance at this time is provided by the series resistance of these four MOS FETs.

Figure 5:
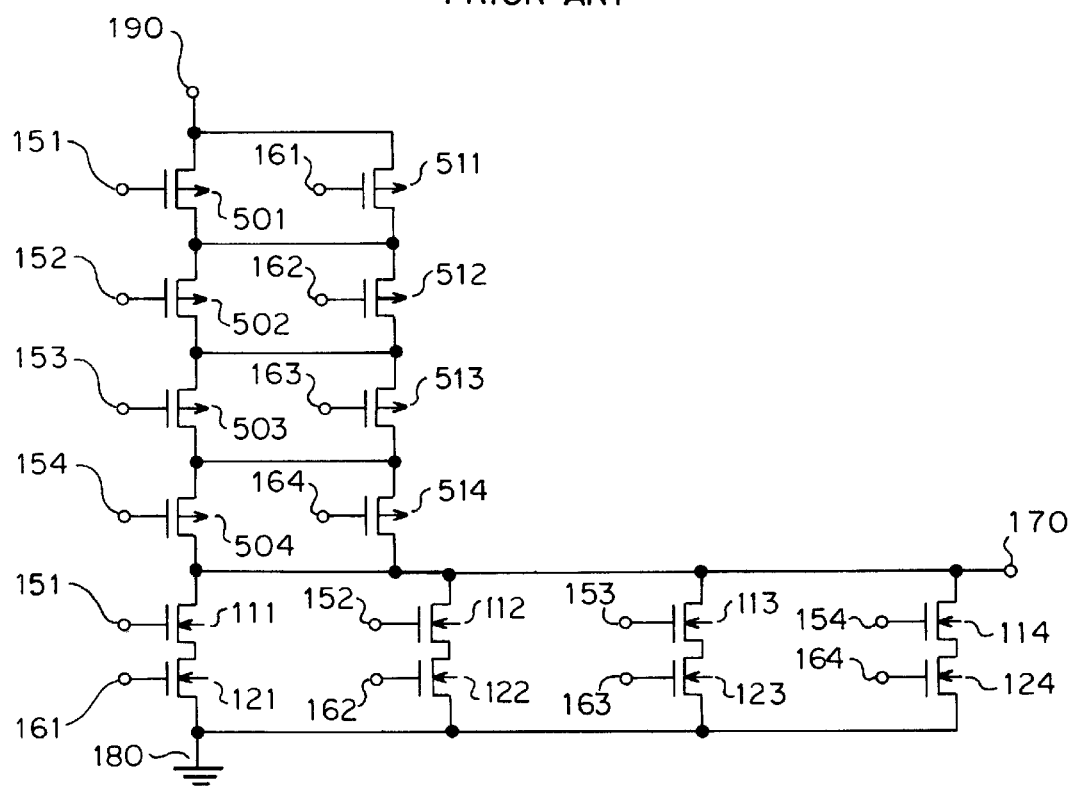
FIG. 5 is a circuit diagram illustrating the conventional circuit of FIG. 3 expanded to have multiple inputs.

Therefore, if the MOS FET sizes in FIG. 5 and FIG. 1 are equal, the circuit of FIG. 5 has four times the resistance of the circuit of FIG. 1. Further, since the number of MOS FETs connected to the path running from the high-potential side power supply terminal 190 to the output terminal 170 is larger than that of the circuit of FIG. 1, the circuit of FIG. 5 has a larger parasitic capacitance than the circuit of FIG. 1. Hence, the circuit of FIG. 5 takes longer for the output terminal 170 to rise from low level to high level. When the output terminal 170 falls from high level to low level, these two circuits have equal conduction resistances and therefore nearly the same parasitic capacitances. Therefore, which means that the fall times are almost equal.

Figure 6:
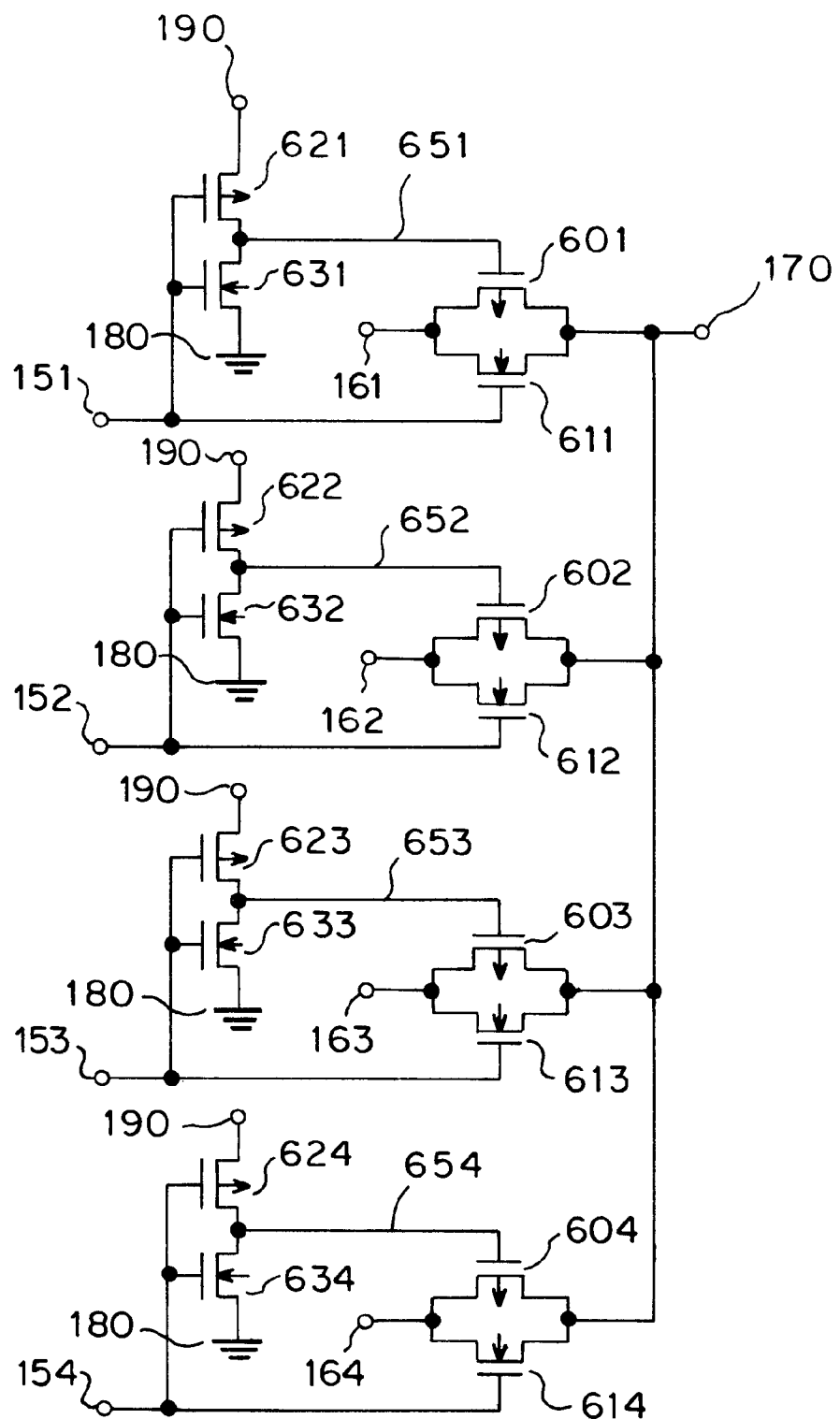
FIG. 6 is a circuit diagram illustrating the conventional circuit of FIG. 4 expanded to have multiple inputs.

Next, it is illustrated that the circuit of FIG. 1 is faster than a circuit illustrated in FIG. 6. In FIG. 1, the parasitic capacitance added to the output terminal 170 is the sum of capacitances of four N-channel type MOS FETs 111–114 and one P-channel type MOS FET 100. The parasitic capacitance added to the output terminal 170 in the circuit of FIG. 6, on the other hand, is the sum of capacitances of four N-channel type MOS FETs 611–614 and four P-channel type MOS FETs 601–604. That is, if the MOS FETs of FIG. 1 and FIG. 6 are equal in size, the parasitic capacitance added to the output terminal 170 in the circuit of FIG. 1 is smaller than that of the circuit of FIG. 6 by an amount corresponding to three P-channel type MOS FETs.

The input capacitances of the input terminals 151–154 in the circuit of FIG. 1 are provided by the gate capacitances of a total of two FETs, i.e., one of N-channel type MOS FETs 111–114 and one of N-channel type MOS FETs 131–134. The input capacitances of the input terminals 151–154 in the circuit of FIG. 6, on the other hand, are provided by the gate capacitances of a total of three FETs, i.e., one of N-channel type MOS FETs 611–614 and one of N-channel type MOS FETs 631–634, plus one of P-channel type MOS FETs 621–624. Hence, the previous stage circuit that drives the input terminals 151–154 has a smaller load when the circuit of FIG. 1 is used than when the circuit of FIG. 6 is used. The circuit of FIG. 1 is therefore faster than the circuit FIG. 6.

Further, the conduction resistance of a P-channel type MOS FET is higher than that of an N-channel type MOS FET if their gate widths are equal. Thus, the P-channel type MOS FET is normally designed to have a larger gate width than the N-channel type MOS FET. Therefore, the P-channel type MOS FET normally has a larger parasitic capacitance than that of the N-channel type MOS FET. In general, a circuit using MOS FETs can form a circuit of the same function even if the polarity of the power supply and the conductivity types of all the MOS FETs are reversed. However, setting the conductivity types of the MOS FETs forming the circuit of FIG. 1 as illustrated in FIG. 1 (i.e., setting the conductivity type of the MOS FET 100, which differs in conductivity type from all other FETs, to a P-channel type) results in all the FETs, except for the MOS FET 100, being an N-channel type whose parasitic capacitance is small, making high-speed operation more prominent when compared with the circuit of FIG. 6 described above.

Still further, when, for example, the logic block 141 in FIG. 1 is selected, the MOS FET 131 turns on and the load added to the intermediate node 175 acts as a load for the previous stage circuit that drives the input terminal 161. The load added to the intermediate node 175 is not influenced by the load added to the output terminal 170 as it is in the circuit of FIG. 6. The load added to the output terminal 170 is not determined until the logic design of LSI is completed, whereas the load added to the intermediate node control 175 is determined when the circuit configuration is determined and will not change during the course of logic design. Hence, the use of the circuit of FIG. 1 prevents the logic design from becoming complicated as it does when the circuit of FIG. 6 is used. Because the intermediate control node 175 is a node only in the circuit of FIG. 1, its wiring is not long, unlike the output terminal 170.

Figure 2:
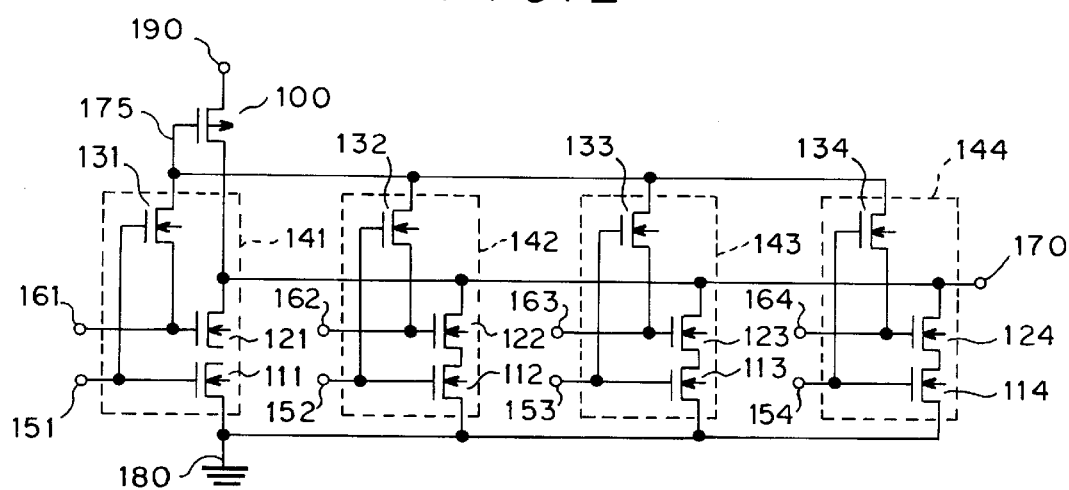
FIG. 2 is a circuit diagram illustrating another embodiment of the logic circuit of the present invention
Figure 3A:
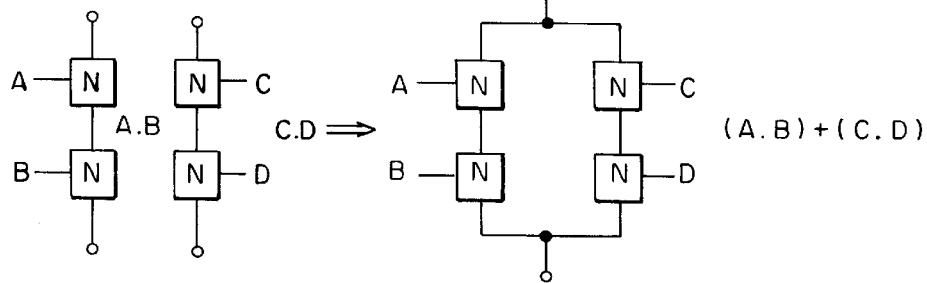
FIG. 3 is a diagram illustrating a conventional circuit transcribed from a literature.
Figure 3B:
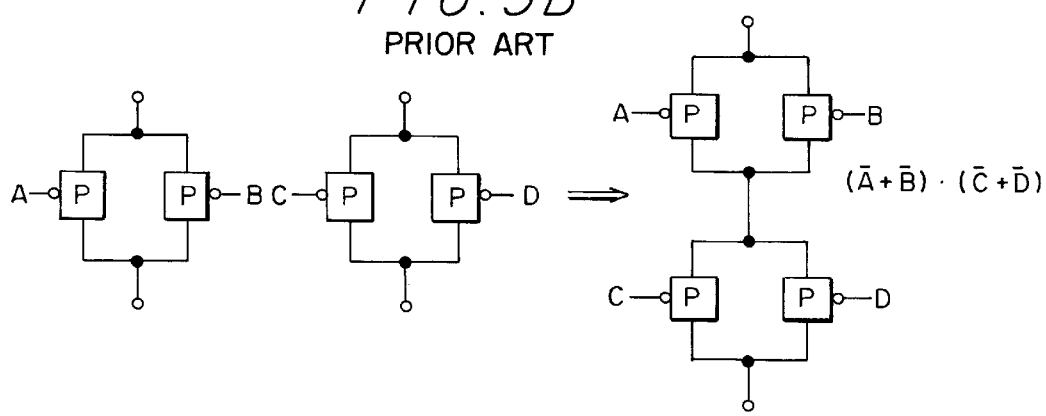
Figure 3C:
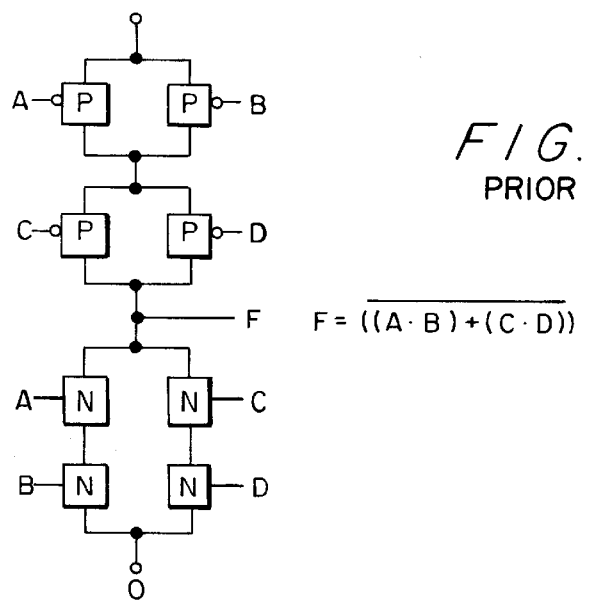
Figure 3C:
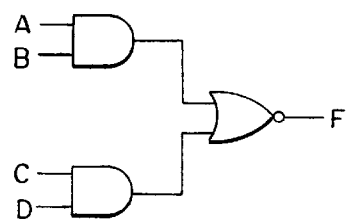
Figure 4A:
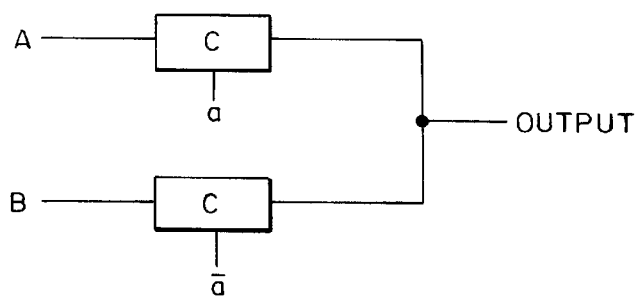
FIG. 4 is a diagram illustrating another conventional circuit transcribed from a literature.
Figure 4B:
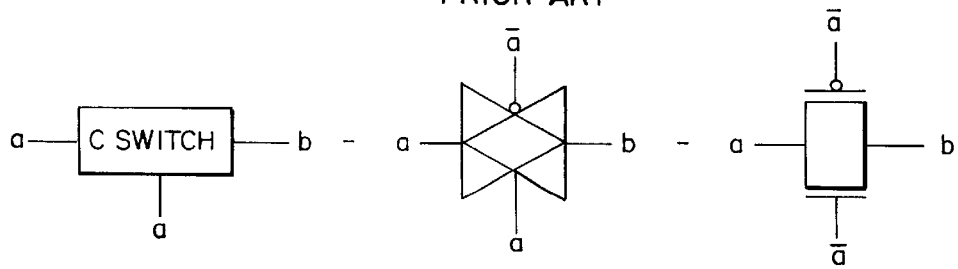
Figure 4C:
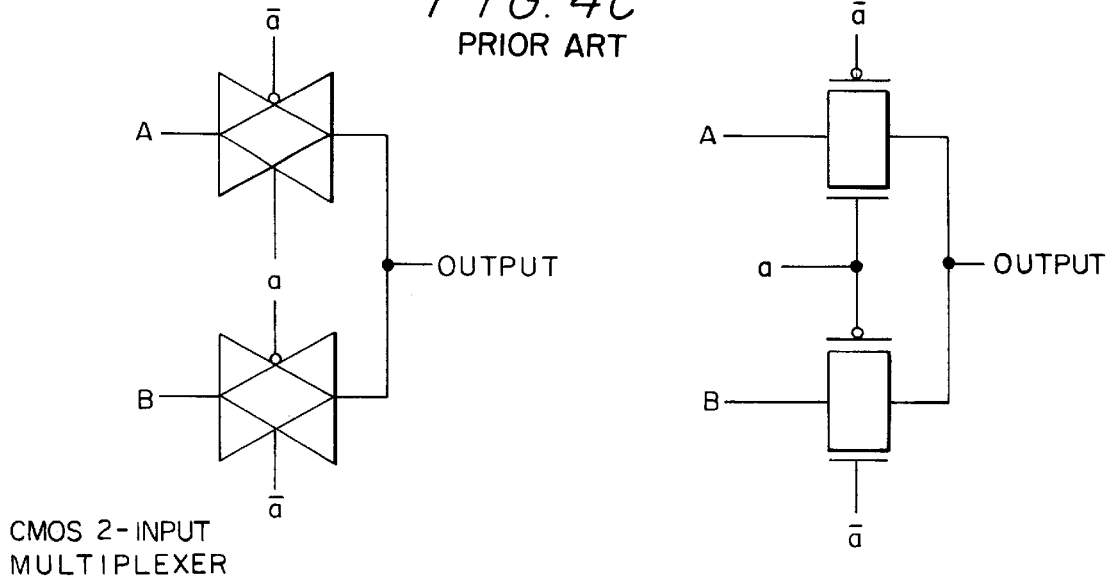

FIG. 2 illustrates another embodiment of the logic circuit of the present invention. The circuit of FIG. 2 is similar to the circuit of FIG. 1, except that the order in which the N-channel type MOS FETs 111–114 and 121–124 are connected in series between the output terminal 170 and the second (low-potential) side power supply terminal 180 differs from that of FIG. 1. The circuit of FIG. 1 is suited for the case where the selectable signals input to the selectable signal terminals 161–164 are determined before the select signals input to the input terminals 151–154, and the circuit of FIG. 2 is suited for the case where the select signals supplied to the input terminals 151–154 are determined before the selectable signals input to the selectable signal terminals 161–164.

For example, where the signal input to the input terminal 161 switches from low level to high level before the signal input to the input terminal 151 changes from low level to high level, the MOS FET 121 has already turned on immediately before the MOS FET 111 turns on, so that in the circuit of FIG. 1 the connecting node between the MOS FETs 111 and 121 is already at low level by the time the MOS FET 111 is turned on. Hence, the nodes that are discharged after the signal input to the input terminal 151 has switched its state include only the node of the output terminal 170. In the circuit of FIG. 2, on the contrary, the connecting node between the MOS FETs 111 and 121 is high immediately before the MOS FET 111 conducts. Hence, the nodes that are discharged after the signal input to the input terminal 151 has switched its state include the connecting node in addition to the node of the output terminal 170. Thus, the circuit of FIG. 2 takes longer to discharge than the circuit of FIG. 1. Therefore, the circuit of FIG. 1 operates faster.

Conversely, where the signal input to the input terminal 161 changes its state from low level to high level after the signal input to the input terminal 151 has changed from low level to high level, the circuit of FIG. 2 operates faster.

Which of these signals, the select signal to 151–154 or the selectable signal to 161–164, establishes its state first is normally often predictable at the stage of LSI logic design. It is thus possible to use whichever of the circuits of FIG. 1 and FIG. 2 is faster based on the result of prediction. In this case, when the order of arrival of the select signal and the selectable signal (the order in which the select signal and the selectable signal are switched to high level or low level) differs for each logic block, it is possible to choose the connection of FIG. 1 or FIG. 2 for each logic block.

Figure 7:
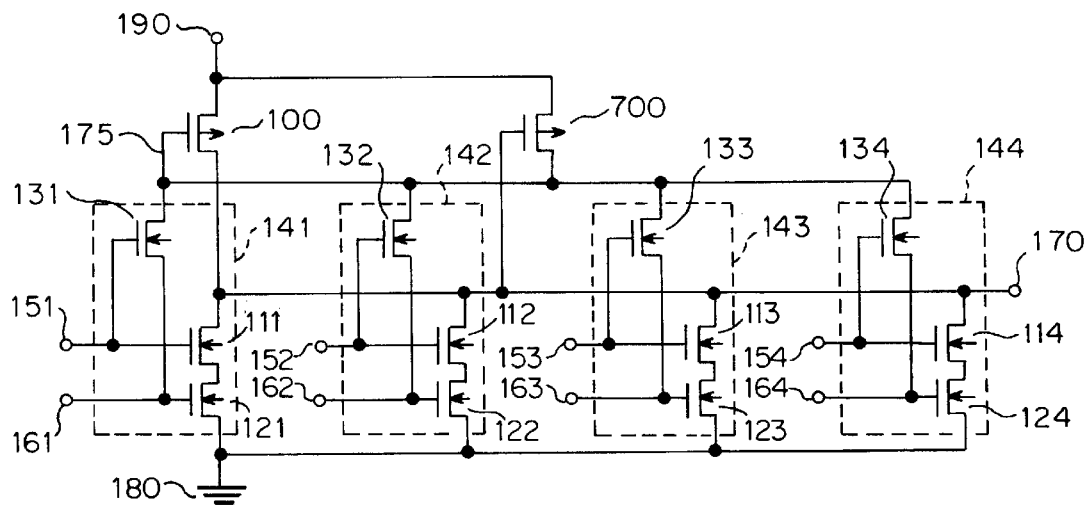
FIG. 7 is a circuit diagram illustrating a further embodiment of the logic circuit of the present invention.

FIG. 7 illustrates a further embodiment of the logic circuit of this invention. The circuit of FIG. 7 is a P-channel type MOS FET 700 added to the circuit of FIG. 1. In the circuit of FIG. 1, when the output terminal 170 is low, the intermediate control node 175 is high. In that case, the intermediate control node 175 does not rise completely to the power supply voltage but to a level a MOS FET 131–134 threshold voltage lower than the supply voltage. Therefore, the MOS FET 100 is not fully turned off, leaving a small leak current to flow. Although this leak current poses almost no problem during normal operation, the method of checking the presence or absence of leak current to detect a failure of the LSI cannot be used.

The embodiment of FIG. 7 is a circuit that makes up for this drawback and is configured so that when the output terminal 170 goes low, the MOS FET 700 conducts to pull the intermediate control node 175 up to the power supply voltage applied to the first power supply terminal 190. Hence, the MOS FET 100 can be completely turned off to eliminate the leak current. The purpose of eliminating the leak current is so that the LSI inspection performed by checking the presence or absence of leak current and the MOS FET 700 need not be operated at high speed. Thus, there is no problem if the MOS FET 700 has a much smaller gate width than that of the MOS FET 100.

Figure 8:
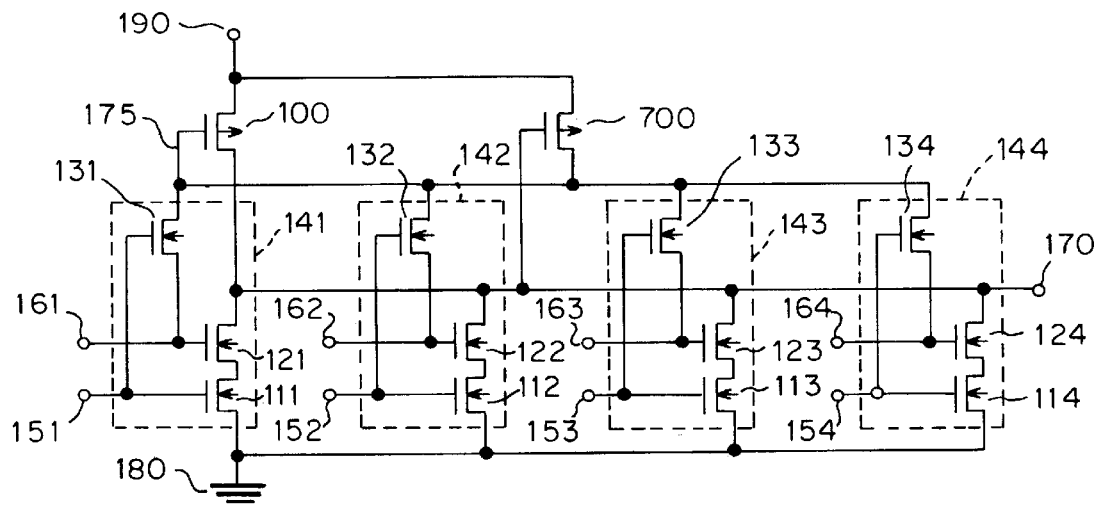
FIG. 8 is a circuit diagram illustrating a further embodiment of the logic circuit of the present invention.

FIG. 8 is a further embodiment of the logic circuit of the present invention. The circuit of FIG. 8 includes a P-channel type MOS FET 700 added to the circuit of FIG. 2. The objective of this circuit is the same as that of changing the circuit of FIG. 1 to the circuit of FIG. 7.

In a normal circuit using MOS FETs, the number of P-channel MOS FETs and the number of N-channel MOS FETs are almost equal. Because the P-channel type MOS FET and the N-channel type MOS FET have different back biases, they need to be arranged a certain distance apart. Thus, it is common practice to provide a row of P-channel type MOS FETs and a row of N-channel type MOS FETs separately so that the MOS FETs of different conductivity types are not present in the same row. With the circuit of the present invention, however, because the numbers of P-channel type MOS FETs and N-channel type MOS FETs greatly differ, arranging these FETs according to the general rule results in a large dead space. Hence, these MOS FETs need to be arranged without any inconsistency with many circuits arranged according to the above rule and without making a dead space. The method and apparatus for realizing this is described below.

Figure 9:
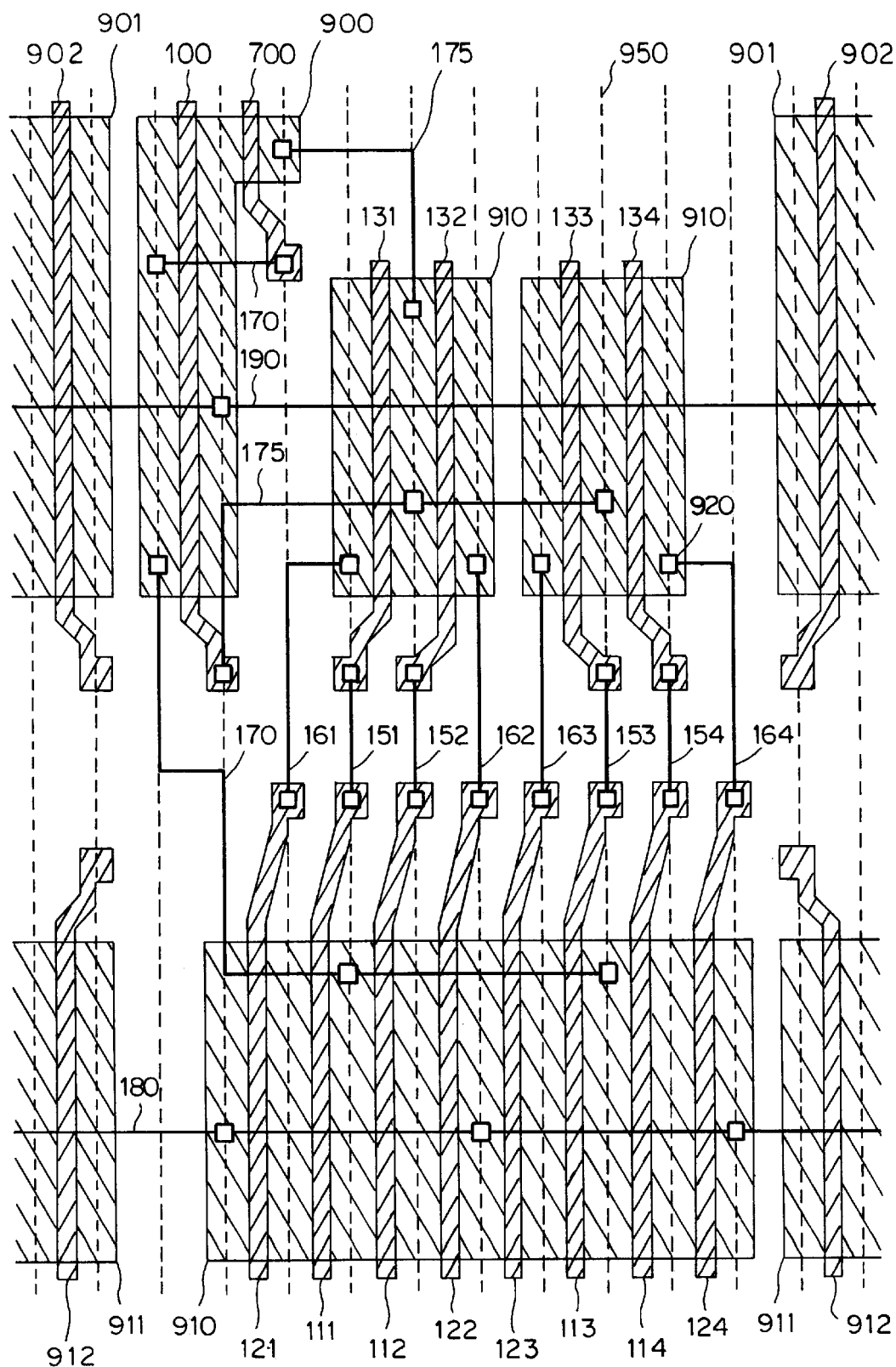
FIG. 9 is a layout diagram illustrating an example layout of the logic circuit of FIG. 7 according to the present invention.

FIG. 9 is a layout diagram showing an example layout of MOS FETs and wires that form the circuit of FIG. 7. In FIG. 9, reference number 900 represents a region of P-channel type MOS FETs forming the circuit of FIG. 7; and 910 represents a region of N-channel type MOS FETs constituting the circuit of FIG. 7. Reference number 100, 111–114, 121–124, 131–234 and 700 in FIG. 9 denote gate electrodes of the MOS FETs 100, 111–114, 121–124, 131–134 and 700 of FIG. 7. Reference numbers 151–154, 161–164, 170, 175, 180, 190 of FIG. 9 are center lines of wires as nodes and terminals 151–154, 161–164, 170, 175, 180, 190 of FIG. 7. Reference number 920 designates contact holes to connect the poles of the MOS FETs and wires. 901 is regions of P-channel type MOS FETs forming adjacent circuits. 902 is gate electrodes of P-channel type MOS FETs forming the adjacent circuits. 911 is regions of N-channel type MOS FETs forming the adjacent circuits. 912 is gate electrodes of N-channel type MOS FETs forming the adjacent circuits. 950 represents channel positions where upper layer wires connecting this circuit and other circuits can be laid.

As is illustrated in FIG. 9, the normal circuits adjacent to the circuit of FIG. 7 includes P-channel type MOS FETs arranged in a row 901 and N-channel type MOS FETs arranged in a row 911. Normally, the high-potential side power supply terminal 290 is laid along the row of the P-channel type MOS FETs and the low-potential side power supply terminal 180 is laid along the row of the N-channel type MOS FETs. The N-channel type MOS FETs forming the circuit of FIG. 7 have its FETs 111–114 and 121–124 arranged in the same row as the N-channel type MOS FETs of other circuits and its FETs 131–134 arranged in the same row as the P-channel type MOS FETs of other circuits.

With this arrangement, the circuit of FIG. 7 can be arranged in an area with a width of 10 channels as illustrated in FIG. 9. The circuit of FIG. 7 has a total of nine input/output signals, eight input terminals and one output terminal, so the circuit having the same function as the circuit of FIG. 7 requires an area with the width of at least nine channels. Thus, forming this circuit in an area with a width of 10 channels as illustrated in FIG. 9 produces almost no wasted space. Further, as illustrated in FIG. 9, a space corresponding to one channel can be secured between the region 910 of the N-channel type MOS FETs and the regions 900 and 901 of the P-channel type MOS FETs.

The conventional circuit of FIG. 6, since the N-channel type MOS FETs 611–614 and 631–634 cannot be arranged without a space, requires an area wider than that illustrated in FIG. 9. As to the conventional circuit of FIG. 5, though it is not impossible to arrange the circuit in the width of nine channels, the P-channel type MOS FETs 501–504 and 511–514 need to be arranged without a space. In that case, depending on the size of the P-channel type MOS FETs, it may not be possible to secure a space for lateral wires connecting the P-channel type MOS FETs.

While this specification has described the configuration of the selector circuit that selects one of four choices, the number of choices is of course not limited to four. The advantage of this invention becomes significant particularly when the number of choices is large.

A possible application of the high-speed multiple input selector circuit of the present invention includes, for example, a selector for switching inputs to operation units in a processor. In principle, the result of an operation output from an operation unit is stored in a register file and the operand to be input to the operation unit is supplied from the register file.

Computers of recent years have paths to input the result of an operation as an operand directly to other operation units in order to increase the operation speed. Further, operation speed is increased by increasing the number of operation units. Under these circumstances, the selector circuit which selects a signal for input to an operation unit is required to select the signal from among many choices. These choices can include, for example, selection of an input from a register file and selection of a result of an operation from among a plurality of operation units.

Specifically, the processor under consideration is configured to include a register buffer to store data, a decoder to decode instructions and output a decoded result, and a plurality of operation units that perform operations on data in the register buffer or an output from another operation unit and then outputs the result of operation to the register buffer or another operation unit. To this processor is introduced a selector circuit, which has a logic circuit including a first MOS FET having a source electrode connected to the first power supply, drain electrode connected to the output terminal and a gate electrode connected to the intermediate control node, and a plurality of logic blocks connected parallelly between the second power supply and the output terminal. The logic blocks each include second and third MOS FETs being of a conductivity type opposite to the conductivity type of the first MOS FET and connected in series between the output terminal and the second power supply, and a fourth MOS FET being of the same conductivity type as the second and third MOS FETs. The fourth MOS FET has a gate electrode connected to the gate electrode of the second FET, a source electrode connected to the gate electrode of the third MOS FET and a drain electrode connected to the intermediate control node. Further, a signal corresponding to the decoded result of the decoder circuit is input to the gate electrode of the second MOS FET, the data in the register buffer or an output from another operation unit is input to the gate electrode of the third MOS FET, and an output from the output terminal is input to another operation unit.

Figure 10:
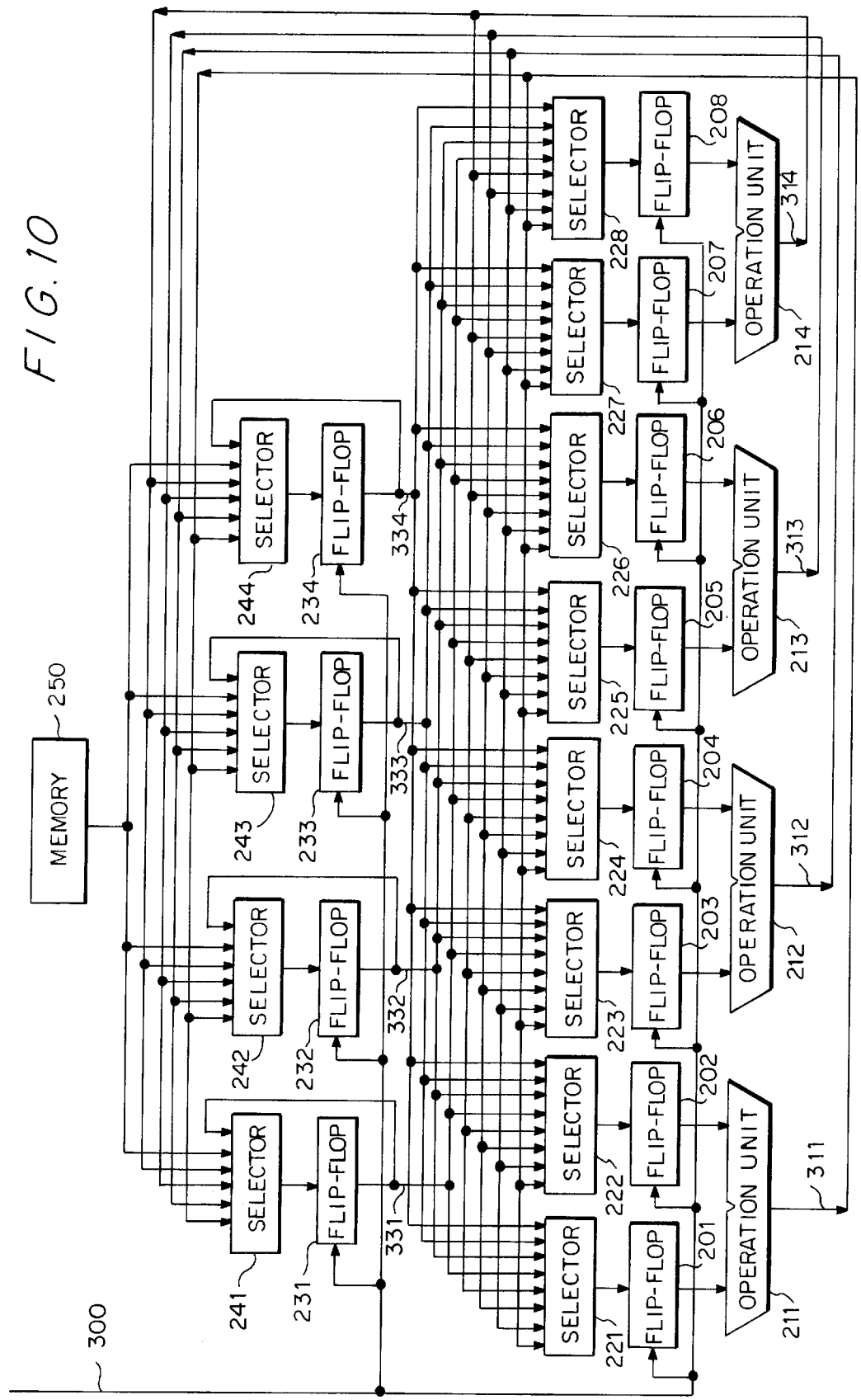
FIG. 10 is a diagram illustrating a portion of a computer which makes use of the present invention.

FIG. 10 illustrates a portion of the structure of a processor in which high speed operation is required. In FIG. 10 the processor is illustrated as having first flip-flops 201–208, operation units 211–214, first selectors 221–228, second flip-flops 231–234, second selectors 241–244, and memory 250. A clock signal line 300 applies a clock signal to the first and second flip-flops 201–208 and 231–234, respectively.

The operation units 211–214 output signals on signal lines 311–314. Signal lines 331–334 supplies signals from flip-flops 231–234 to the first selectors 221–228. In FIG. 10, the clock signal line 300 is illustrated as being connected to the first and second flip-flops 201–208 and 231–234, respectively, and data signal lines illustrated as being connected to the first and second selectors 221–228 and 241–244, respectively, the operation units 211–214, and the memory 250. However, control signal lines for controlling the first and second selectors 221–228 and 241–244, respectively, the memory 250 and the operating units 211–214 are not illustrated.

If, for example, each of the operation units 211–214 has the capability of 64-bit operation, then each of the first and second flip-flops 201–208 and 231–234, respectively, are required to have a 64-bit bundle of flip-flops. Further, each of the first and second selectors 221–228 and 241–244 are required to have a 64-bit bundle of selectors, and each of the signal lines, except the clock signal line 300, are required to have a 64-bit bundle of signal lines.

Typically, the portion of the processor illustrated in FIG. 10 including the first flip-flops 201–208, the operation units 211–214 and the first selectors 221–228 is called the operation part. Further, the portion of the processor illustrated in FIG. 10 including the second flip-flops 231–234 and the second selectors 241–244 is called the register part. The memory 250 is typically a cache memory.

The signals stored in the first flip-flops 201 and 202 are output to the operation unit 211 based on the clock signal supplied by clock signal line 300. The operation unit 211 supplies an output signal on signal line 311 to the first selectors 221–228. Similarly the operation units 212–214 supply output signals on signal lines 312–314 to the first selectors 221–228. Selector 221 selects the desired one among the output signals provided by signal lines 311–314 from the operation units 211–214 and the output signals provided by signal lines 331–334 from the second flip-flops 231–234, and supplies the selected signal to the first flip-flop 201.

Thus, the path delay of the loop signal path including the first flip-flop 201, the operation unit 211, and the first selector 221, must be less than the period of the clock signal supplied on clock signal line 300. Also the path delay of the signal path including one of the first flip-flops 202–208, one of the operation units 211–214 and the first selector 221, must be less than the period of the clock signal supplied on clock signal line 300. Therefore, if the high speed selector of the present invention as described above is used as the first selector 221, the above-described path delays will be reduced and a shorter clock signal period can be used. The same applies to the others of the first selectors 222–228.

Second selector 241 selects the desired one among the output signal signals lines 311–314 from the operation units 211–214, the signal from the memory 250, and the output signal on signal line 331 from the second flip-flop 231, and supplies the selected signal-to the second flip-flop 231. The second flip-flop 231 outputs the signal stored therein based on the clock signal supplied by clock signal line 300.

Thus, the path delay of the signal path including one of the first flip-flops 201–208, one of the operation units 211–214, and the second selector 241, must be less than the period of the clock signal supplied by the clock signal line 300. Therefore, if the high speed selector of the present invention as described above is used as the second selector 241, the above-described path delay will be reduced and a shorter clock signal period can be used. The same applies to the others of the second selectors 242–244.

The processor using the selector circuit of the present invention has the advantages as explained above. Further, its operation speed is not reduced as much as the conventional processor when the number of choices increases. Still further, at the same operation speed, the size of the processor which makes use of the selector circuit of the present invention can be reduced when compared with the conventional processor. Therefore, the selector circuit of the present invention is particularly suited to a type of processor that tends to increase in size.

With the logic circuit of the present invention a selector circuit can be achieved in which operation speed is not reduced when compared to a conventional circuit especially when the number of choices increases. Further, the logic circuit of the present invention can realize a selector circuit that can be formed in an area smaller than the conventional circuit and have a speed the same as or lower than that of the conventional circuit. Still further, the logic circuit of the present invention can achieve a selector circuit in which a load added to the output terminal does not influence the previous stage or succeeding circuits. Still further yet, the logic circuit of the present invention can realize a selector circuit that achieves the above three objectives and prevents a leak current from flowing during a normal operation.

While the present invention has been described in detail and pictorially in the accompanying drawings, it is not limited to such details since many changes and modification recognizable to these of ordinary skill in the art may be made to the invention without departing from the spirit and scope of the invention, and all such modifications as would be obvious to one skilled in the art are intended to be included within the scope of the following claims.

We claim:

1. A logic circuit comprising:
    a first field effect transistor (FET) having a first electrode connected to a first power supply, a second electrode connected to an output terminal and a third electrode connected to an intermediate control node; and
    a plurality of logic blocks parallelly connected between a second power supply and the output terminal,
    wherein each logic block comprises:
       second and third FETs being of a conductivity type opposite to that of the first FET and connected in series between the output terminal and the second power supply, and
       a fourth FET being of the same conductivity type as the second and third FETs and having a third electrode connected to the third electrode of the second FET, a first electrode connected to the third electrode of the third FET and a second electrode connected to the intermediate control node.

2. A logic circuit according to claim 1, wherein a select signal is input to the third electrode of the second FET of each of the plurality of logic blocks and a selectable signal is input to the third electrode of the third FET of each of the plurality of logic blocks.

3. A logic circuit according to claim 1, wherein each of said FETs are of the MOS transistor type.

4. A logic circuit according to claim 3, wherein the conductivity type of the first FET is a P-channel type and the conductivity type of each of the second to fourth MOS transistors is an N-channel type.

5. A logic circuit according to claim 2, wherein each of said FETs are of the MOS transistor type.

6. A logic circuit according to claim 5, wherein the conductivity type of the first MOS transistor is a P-channel type and the conductivity type of each of the second to fourth MOS transistors is an N-channel type.

7. A logic circuit according to claim 1, wherein each of said FETs are of the junction type.

8. A logic circuit according to claim 2, wherein each of said FETs are of the junction type.

9. A logic circuit according to claim 1, further comprising:
    a fifth FET being of the same conductivity type as the first FET, and having a first electrode connected to the first power supply, third electrode connected to the output terminal and a second electrode connected to the intermediate control node.

10. A logic circuit according to claim 2, further comprising:
    a fifth FET being of the same conductivity type as the first FET, and having a first electrode connected to the first power supply, a third electrode connected to the output terminal and a second electrode connected to the intermediate control node.

11. A logic circuit according to claim 3, further comprising:
    a fifth FET being of the same conductivity type as the first FET, and having a first electrode connected to the first power supply, a third electrode connected to the output terminal and a second electrode connected to the intermediate control node.

12. A logic circuit according to claim 5, further comprising:
    a fifth FET being of the same conductivity type as the first FET, and having a first electrode connected to the first power supply, a third electrode connected to the output terminal and a second electrode connected to the intermediate control node.

13. A logic-circuit according to claim 7, further comprising:
    a fifth FET being of the same conductivity type as the first FET, and having a first electrode connected to the first power supply, a third electrode connected to the output terminal and a second electrode connected to the intermediate control node.

14. A logic circuit according to claim 8, further comprising:
    a fifth FET being of the same conductivity type as the first FET, and having a first electrode connected to the first power supply, a third electrode connected to the output terminal and a second electrode connected to the intermediate control node.

15. A processor comprising:
    a register buffer which stores data;
    a decoder which decodes instructions and outputs a decoded result;
    a plurality of operation units each of which performs an operation on data in the register buffer or an output from another operation unit according to the decoded result and outputs a result of the operation to the register buffer or said another operation unit; and
    a logic circuit having a first FET with a first electrode connected to a first power supply, a second electrode connected to an output terminal and a third electrode connected to an intermediate control node, and a plurality of logic blocks parallelly connected between a second power supply and the output terminal,
    wherein each logic block comprises:
       second and third FETs being of a conductivity type opposite to that of the first FET and connected in series between the output terminal and the second power supply, and a fourth FET being of the same conductivity type as the second and third FETs, and having a third electrode connected to the third electrode of the second FET, a first electrode connected to the third electrode of the third FET and a second electrode connected to the intermediate control mode, wherein a signal responding to the decoded result of the decoder circuit is input to the third electrode of the second FET, data in said register buffer or an output from one of the operation units is input to the third electrode of the third FET, and an output from the output terminal is input to the operation unit.

16. A processor according to claim 15, wherein a select signal is input to the third electrode of the second FET of each of the plurality of logic blocks and a selectable signal is input to the third electrode of the third FET of each of the plurality of logic blocks.

17. A processor according to claim 15, wherein each of said FETs are of the MOS transistor type.

18. A processor according to claim 15, wherein the conductivity type of the first FET is a P-channel type and the conductivity type of each of the second to fourth MOS transistors is an N-channel type.

19. A processor according to claim 16, wherein each of said FETs are of the MOS transistor type.

20. A processor according to claim 19, wherein the conductivity type of the first MOS transistor is a P-channel type and the conductivity type of each of the second to fourth MOS transistors is an N-channel type.

21. A processor according to claim 15, wherein each of said FETs are of the junction type.

22. A processor according to claim 16, wherein each of said FETs are of the junction type.

23. A processor according to claim 15, wherein said logic circuit further comprises:

a fifth FET being of the same conductivity type as the first FET, and having a first electrode connected to the first power supply, third electrode connected to the output terminal and a second electrode connected to the intermediate control node.

24. A processor according to claim 16, wherein said logic circuit further comprises:

a fifth FET being of the same conductivity type as the first FET, and having a first electrode connected to the first power supply, a third electrode connected to the output terminal and a second electrode connected to the intermediate control node.

25. A processor according to claim 17, wherein said logic circuit further comprises:

a fifth FET being of the same conductivity type as the first FET, and having a first electrode connected to the first power supply, a third electrode connected to the output terminal and a second electrode connected to the intermediate control node.

26. A processor according to claim 19, wherein said logic circuit further comprises:

a fifth FET being of the same conductivity type as the first FET, and having a first electrode connected to the first power supply, a third electrode connected to the output terminal and a second electrode connected to the intermediate control node.

27. A processor according to claim 21, wherein said logic circuit further comprises:

a fifth FET being of the same conductivity type as the first FET, and having a first electrode connected to the first power supply, a third electrode connected to the output terminal and a second electrode connected to the intermediate control node.

28. A processor according to claim 22, wherein said logic circuit further comprises:

a fifth FET being of the same conductivity type as the first FET, and having a first electrode connected to the first power supply, a third electrode connected to the output terminal and a second electrode connected to the intermediate control node.

29. A selector circuit comprising:

a plurality of select signal terminals to which select signals are input;

a plurality of selectable signal terminals to which selectable signals are input, each selectable signal terminal corresponds to one of said select signal terminals;

a first power supply terminal and a second power supply terminal; and an output terminal which outputs, according to the select signals input to the select signal terminals, a selectable signal input to one of the selectable signal terminals;

wherein when the select signals are input to the select signal terminals, selectable signals input to the selectable signal terminals control conduction between the first power supply terminal and the output terminal and conduction between the second power supply terminal and the output terminal; and wherein when non-select signals are input to the select signal terminals, conduction between the first power supply terminal and the output terminal is turned off and conduction between the second power supply terminal and the output terminal is turned off.

30. A method of selecting selectable signals based on select signals in a circuit including a plurality of select signal terminals to which the select signals are input, a plurality of selectable signal terminals to which the selectable signals are input, each selectable signal terminal corresponds to one of the select signal terminals, a first power supply terminal, a second power supply terminal, and an output terminal which outputs, according to the select signals input to the select signal terminals, a selectable signal input to one of the selectable signal terminals, said method comprising the steps of:

when select signals are input to the select signal terminals, controlling based on selectable signals input to the selectable signal terminals, conduction between the first power supply terminal and the output terminal and conduction between the second power supply terminal and the output terminal; and when non-select signals are input to the select signal terminals, turning off conduction between the first power supply terminal and the output terminal turning off and conduction between the second power supply terminal and the output terminal.

* * * * *